(12) United States Patent
Jaiswal

(10) Patent No.: US 7,354,854 B2
(45) Date of Patent: Apr. 8, 2008

(54) NICKEL SILICIDE METHOD AND STRUCTURE

(75) Inventor: Rajneesh Jaiswal, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 409 days.

(21) Appl. No.: 11/136,159

(22) Filed: May 24, 2005

(65) Prior Publication Data

US 2006/0267117 A1 Nov. 30, 2006

(51) Int. Cl.
*H01L 21/4763* (2006.01)
(52) U.S. Cl. .................. 438/630; 438/655; 257/21.199
(58) Field of Classification Search .............. 438/197, 438/199, 630, 655, 664, 721, 682; 257/E21.199, 257/E21.439, E21.593, E21.619, E21.622, 257/E21.636
See application file for complete search history.

(56) References Cited

U.S. PATENT DOCUMENTS 6,350,677 B1 * 2/2002 Ko et al. ................ 438/630
6,632,740 B1 * 10/2003 Bertrand et al. ............ 438/682
6,797,598 B2 * 9/2004 Lim et al. .................. 438/586

OTHER PUBLICATIONS

"*Nickel* vs. *Cobalt Silicide* integration for sub-50nm CMOS" by Froment et al., ESSDERC-ESSCIRC 2003 Papers, 4 pages.
"Silicon Processing for the VLSI ERA", vol. 2, Process Integration, S. Wolf, Lattice Press, 1985, p. 398 (3 sheets).

* cited by examiner

*Primary Examiner*—Hoai v Pham
(74) *Attorney, Agent, or Firm*—W. James Brady, III; Frederick J. Telecky, Jr.

(57) ABSTRACT

Nickel silicide contact regions are formed on a source (2), drain (3) and polycrystalline silicon gate (5) of an integrated circuit transistor by annealing it after a nickel layer has been deposited on the source, drain, and gate, with no cap layer on the nickel layer. Nickel silicide bridging between the gate and source and/or drain is avoided or eliminated by using a chrome etching process to remove un-reacted nickel and nickel remnants from exposed surfaces of dielectric spacers (6A,B) located between the gate and source and between the gate and drain. The chrome etching process includes use of a solution including cerric ammonium nitrate, nitric acid, and acetic acid.

6 Claims, 3 Drawing Sheets

NICKEL SILICIDE METHOD AND STRUCTURE

BACKGROUND OF THE INVENTION

The present invention relates generally to a new technique for manufacturing an integrated circuit nickel silicide/salicide structure, and more particularly to a structure and method that do not result in nickel silicide "remnants" which cause the bridging or "pipe formation" that may result in internal electrical short-circuiting. (The term "salicide" refers to self-aligned silicide.)

It is well known that the electrical connection which is achievable by forming aluminum conductors directly on a doped electrode (e.g., a doped electrode of a source, drain, or polycrystalline gate layer) of an integrated circuit transistor has higher contact resistance than is desirable. Aluminum-to-doped-electrode connections also have the additional problem of junction spiking due to aluminum migration during subsequent high temperature processing. Today's state-of-the-art electrode contact structures involve using a silicide/salicide followed by a barrier metal and subsequently deposited conductor material consisting of aluminum or copper, depending on the technology, as indicated in the publication "SILICON PROCESSING FOR THE VLSI ERA", Vol. 2, Process Integration, S. Wolf, Lattice Press.

In the past, titanium silicide contacts have been commonly used in processes having device geometry dimensions greater than approximately 0.25 microns, and cobalt silicide contacts are used for processes having device geometry dimensions in the range from about 130 nanometers to 250 nanometers. For more recent integrated circuit manufacturing processes having device geometry dimensions of 130 nanometers or less, nickel silicide contacts are now being used instead of cobalt silicide contacts because the manufacture of nickel silicide contacts is much more compatible with the very narrow polycrystalline silicon gate electrode conductors of the newest processes than is the case for cobalt silicide contacts. This probably is because grains in nickel silicide are substantially smaller than the grains in cobalt silicide and therefore are more capable of forming silicide over the extremely narrow polycrystalline silicon gate conductors without silicide bridging or pipe formation between polycrystalline silicon gate conductors and source or drain electrodes of CMOS transistors. Also, nickel silicide contacts do not display certain undesirable leakage or Schottky characteristics that often are present in cobalt silicide contacts.

FIG. 1 shows a typical N-channel CMOS transistor structure after the N+ source region 2 and the N+ drain region 3 have been formed in a lightly doped P-type silicon layer 1. A very thin (e.g., less than 25 Angstroms) gate dielectric layer 4 has been formed on a surface area of P-type layer 1 between the edges of source region 2 and drain region 3, as shown. A doped polycrystalline silicon gate layer 5 has been formed on gate dielectric layer 4. An oxide layer 7 with the indicated openings also has been formed, as shown.

FIG. 2 shows the structure of FIG. 1 after oxide side-wall "spacers" 6A and 6B have been formed on the surface areas of P-type layer 1 along the opposed edges of polycrystalline silicon gate conductor 5, as illustrated. Spacers 6A and 6B typically are formed of silicon nitride, silicon oxide, or a combination of silicon nitride and silicon oxide. Spacers 6A and 6B are provided to prevent the subsequently described gate-to-source and/or gate-to-drain "nickel silicide bridging" or "nickel silicide pipe formation" from occurring between polycrystalline silicon gate 5 and source region 2 and/or drain region 3 of the illustrated transistor.

FIG. 3 illustrates the structure of FIG. 2 after a nickel layer 10 has been deposited on its upper surface using conventional nickel deposition techniques. A titanium nitride "cap" layer 12 has been deposited on nickel layer 10. (Titanium and cobalt also have been utilized as a metal layer 10 to form titanium silicide or cobalt silicide. Titanium nitride has been used as a cap layer for protecting the "siliciding" metal layer from oxidation.) Cap layers such as cap layer 12 are used to prevent oxidation of the nickel metal from which the nickel silicide is formed and also to provide thermal stability during subsequent annealing.

The next step in the conventional procedure of nickel silicide formation is to subject the structure shown in FIG. 3 to a first annealing step at a temperature of approximately 250-300 degrees Centigrade for approximately 30 seconds. Then a standard etch back process is performed. The standard etch back process has been performed using ammonium hydroxide/peroxide (SC1)), followed by a sulfuric peroxide mixture (SPM).

Referring to FIG. 4, the above-mentioned first annealing results in formation of di-nickel silicide ($Ni_2Si$) layer 14A at the surface of source region 2, $Ni_2Si$ layer 14B at the surface of drain region 2, and $Ni_2Si$ layer 16 at the upper surface of polycrystalline silicon layer 5, as shown. Some nickel metal remains on the upper surfaces of side-wall spacers 6A and/or 6B.

FIG. 5 shows the structure that results after cap layer 12 and un-reacted nickel of layer 10 have been etched away. At this point, all of the un-reacted nickel metal theoretically should have been stripped off and there should be no nickel silicide left on the side-wall spacers 6A and 6B. The desired nickel silicide layers 14 and 16 should be ready for the next annealing step, and for an interconnect metallization step after that.

But as a practical matter, some nickel remnants often remain on the surfaces of side-walls 6A and 6B. In FIG. 5, reference numeral 8 illustrates an example of undesired nickel silicide bridging or nickel silicide pipe formation that may cause electrical shorting and reduction of manufacturing yield.

The above described nickel silicide bridging or pipe formations have been a substantial problem and have caused substantially reduced manufacturing yields.

The structure of FIG. 5 ordinarily includes a second phase of nickel silicide formation. The second phase ordinarily is accomplished by means of a second annealing procedure at a temperature in the range of approximately 400-550 degrees Centigrade for approximately 30 to 60 seconds in order to form the desired nickel silicide (NiSi) phase.

Thus, there is an unmet need for a way of manufacturing integrated circuits including nickel silicide electrode contact layers so as to avoid nickel silicide bridging or pipe formation that results in internal electrical short-circuits.

There is another unmet need for a way of manufacturing integrated circuits in which nickel silicide remnants that lead to bridging or pipe formation are avoided or eliminated.

There is another unmet need for a way of manufacturing integrated circuits in which the etchant chemistry completely eliminates any un-reacted nickel that may cause nickel silicide bridging or pipe formation.

SUMMARY OF THE INVENTION

It is an object of the invention to provide a way of manufacturing integrated circuits including nickel silicide electrode contact layers so as to avoid or eliminate nickel silicide bridging or pipe formation that may result in internal electrical short-circuits.

It is another object of the invention to provide a way of manufacturing integrated circuits which avoids or eliminates formation of nickel silicide remnants that lead to bridging or pipe formation.

It is another object of the invention to provide a way of manufacturing integrated circuits without having to form cap layers over deposited nickel from which nickel silicide is formed.

It is another object of the invention to provide a way of manufacturing integrated circuits in which the etchant chemistry completely eliminates any un-reacted nickel that may cause nickel silicide bridging or pipe formation.

Briefly described, and in accordance with one embodiment, the present invention provides nickel silicide contact regions on a source (2), drain (3) and polycrystalline silicon gate (5) of an integrated circuit transistor by annealing it after a nickel layer has been deposited on the source, drain, and gate, with no cap layer on the nickel layer. Nickel silicide bridging between the gate and source and/or drain is avoided or eliminated by using a chrome etchant chemistry to remove un-reacted nickel and nickel remnants from exposed surfaces of dielectric spacers (6A,B) between the gate and source and between the gate and drain. The chrome etchant includes cerric ammonium nitrate, nitric acid, and acetic acid. In a described embodiment, the invention provides an integrated circuit structure including a silicon layer (1) having a surface, a source region (2) and a drain region (3) of a transistor disposed in the silicon layer (1) at its surface, and a gate dielectric layer (4) disposed on the surface of the silicon layer (1) on an area located between the source region (2) and the drain region (3). A polycrystalline silicon gate electrode (5) is disposed on the gate dielectric layer (4). A first dielectric spacer (6A) is disposed on the surface of the silicon layer (1) along an edge of the polycrystalline silicon gate electrode (5), and a second dielectric spacer (6B) is disposed on the surface of the silicon layer (1) along another edge of the polycrystalline silicon gate electrode (5). A layer of oxide (7) and an opening in the layer of oxide exposes the source (2) and drain (3) regions and also exposes the polycrystalline silicon gate electrode (5) and also exposes surfaces of the first (6A) and second (6B) dielectric spacers. A first nickel silicide layer (14A) is disposed on the source region (2) covering a surface of the source region (2), a second nickel silicide layer (14B) is disposed on the drain region (3) covering a surface of the drain region (3), and a third nickel silicide layer (16) is disposed on the polycrystalline silicon gate electrode (5). First (20) and second (22) metal interconnection conductors electrically contact the first (14A) and second (14B) nickel silicide layers, respectively.

In one embodiment, the invention provides a method of making an integrated circuit including nickel silicide contact regions, including providing a first structure including a silicon layer (1) having a surface, a source region (2) and a drain region (3) of a transistor disposed in the silicon layer (1) at its surface, a gate dielectric layer (4) disposed on the surface of the silicon layer (1) on an area located between and spaced from the source region (2) and the drain region (3), a polycrystalline silicon gate electrode (5) disposed on the gate dielectric layer (4), a first dielectric spacer (6A) disposed on the surface of the silicon layer (1) covering the space between the source region (2) and an edge of the polycrystalline silicon gate electrode (5), and a second dielectric spacer (6B) disposed on the surface of the silicon layer (1) covering the space between the drain region (3) and another edge of the polycrystalline silicon gate electrode (5), and a layer of oxide (7) and an opening in the layer of oxide exposing the source (2) and drain (3) regions and also exposing at least a portion of the polycrystalline silicon gate electrode (5) and also exposing surfaces of the first (6A) and second (6B) dielectric spacers. A nickel layer (10) is formed on an exposed surface of the first structure. A first annealing process is performed to cause formation of first (14A) and second (14B) nickel silicide regions in surface portions of the source (2) and drain (3) regions, respectively, in contact with the nickel layer (10) and to cause formation of a third nickel silicide region (16) in a portion of the polycrystalline silicon gate electrode (5) in contact with the nickel layer (10). A chrome etch solution is used to both (1) remove un-reacted nickel from the first structure and (2) remove all nickel remnants, such as nickel oxide or nickel nitride or other nickel precipitate, from the exposed surfaces of the first (6A) and second (6B) dielectric spacers. A second annealing process is formed to complete formation of the first (14A), second (14B), and third (16) nickel silicide regions.

The chrome etchant used in the chrome etching process includes cerric ammonium nitrate, nitric acid, and acetic acid. After the first silicide annealing procedure has been performed, the chrome etchant is used to remove all un-reacted nickel and any nickel precipitates. Then a sulfuric peroxide cleaning procedure is performed on the wafer, followed by the above mentioned second silicide annealing procedure.

DETAILED DESCRIPTION OF THE PREFERRED EMBODIMENTS

Figure 1:
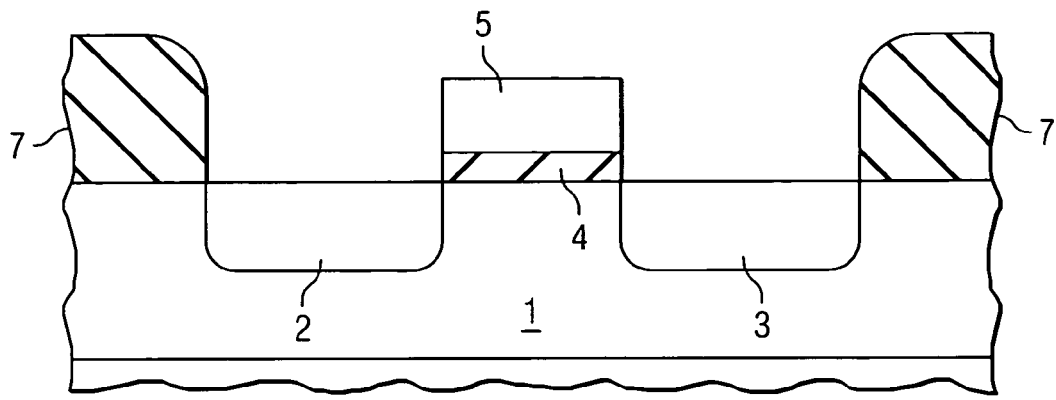
FIGS. 1-5 are a sequence of section view diagrams illustrating a prior art technique for forming nickel silicide contacts to gate, source and drain electrodes of a transistor.
Figure 2:
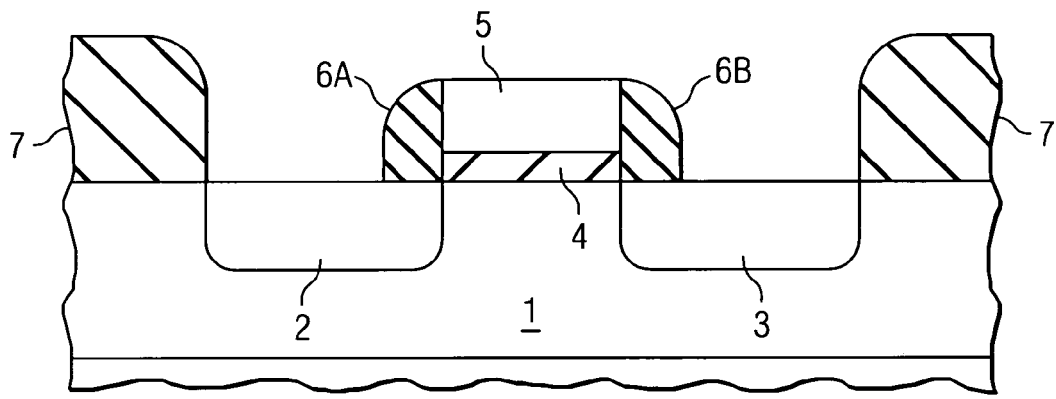
Figure 3:
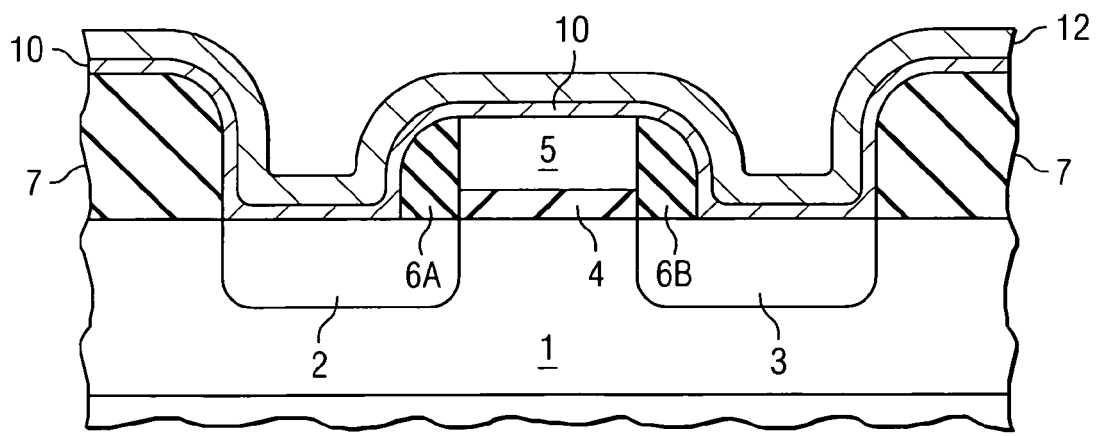
Figure 4:
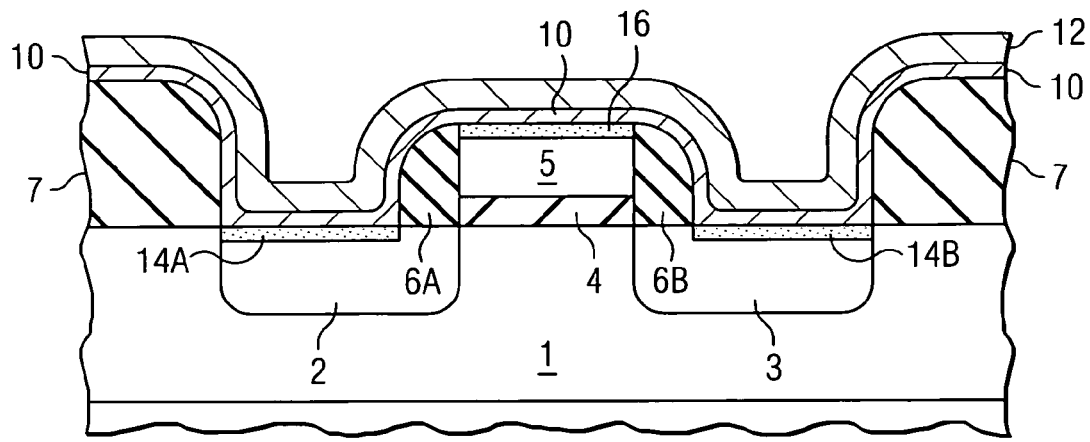
Figure 6:
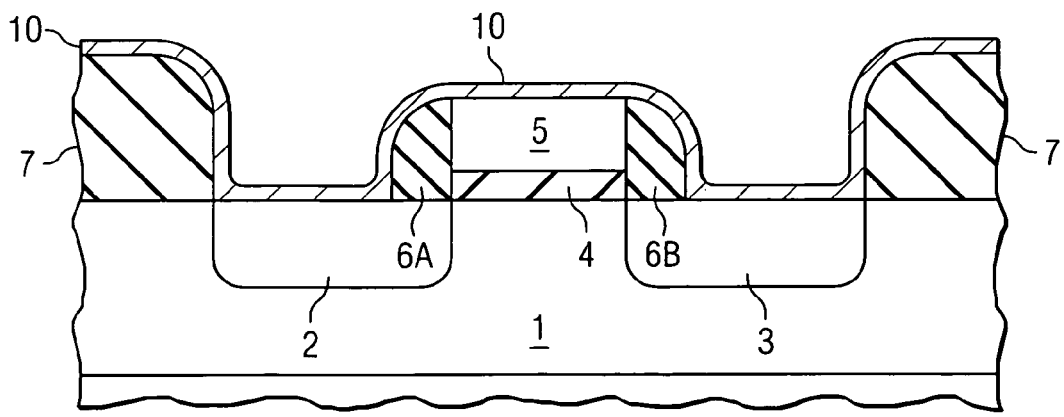
FIGS. 6-9 are a sequence of section view diagrams illustrating a technique according to the present invention for forming nickel silicide contacts in an integrated circuit structure.

The present invention avoids use of the cap layer 12 shown in prior art FIGS. 3 and 4. The starting point for the method of making the nickel silicide structure of the present invention is the structure shown in above described prior art FIG. 2. Referring to FIG. 6, a nickel layer 10 is deposited on the entire upper surface of the wafer sub-structure shown in FIG. 2. However, it should be noted that no cap layer such as titanium nitride cap layer 12 in prior art FIG. 2 is deposited on nickel layer 10.

The next step in the formation of a nickel silicide structure according to the present invention is to subject the structure shown in FIG. 6 to a first anneal procedure. The first anneal procedure can be according to conventional practice, at approximately 250-300 degrees Centigrade for approximately 30 seconds. Instead of using a conventional clean and etch back process using SC1 and SPM (i.e., "sulfuric acid & peroxide mixture") chemistry, a chrome etchant and SPM chemistry is used.

Figure 7:
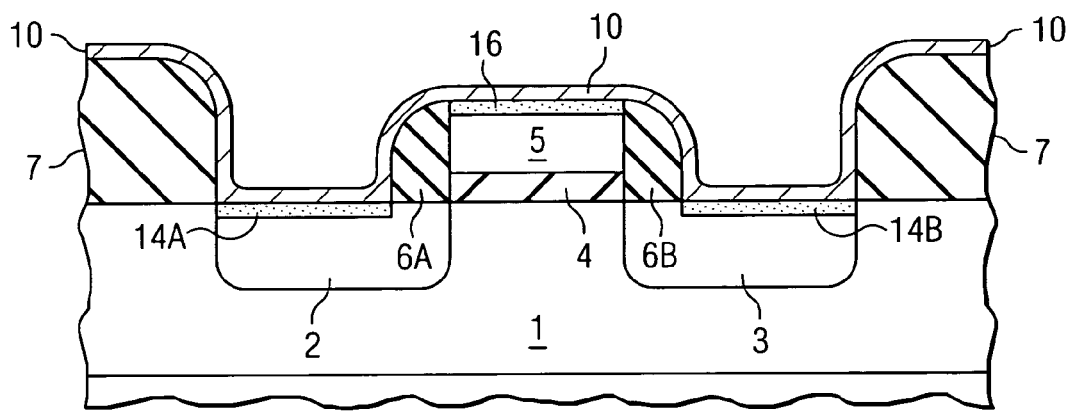

Referring to FIG. 7, the first anneal procedure results in formation of a first $Ni_2Si$ (di-nickel silicide) phase of the desired nickel silicide layers 14A and 14B within source and drain regions 2 and 3, respectively, and also results in formation of a first $Ni_2Si$ phase of the desired nickel silicide layer 16 on the upper surface of polycrystalline silicon gate layer 5. The nickel layer 10 of which the nickel silicide is being formed becomes depleted in regions of the transistor source 2, drain 3 and gate 5 due to silicide formation, and a portion of nickel layer 10 remains on side-wall spacers 6A and 6B.

Figure 8:
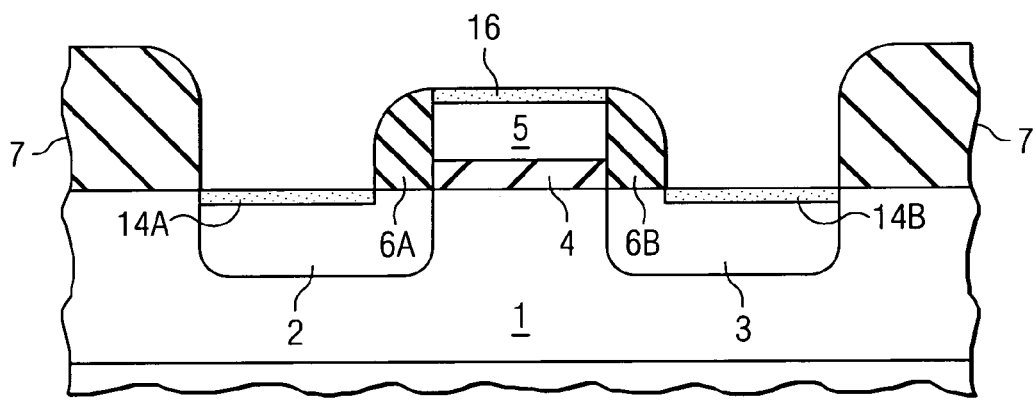

FIG. 8 shows the structure after all of the un-reacted portion of nickel layer 10 has been stripped using the subsequently described chrome etching procedure in accordance with the present invention.

The chrome etch solution used in the present invention is well known, and is commonly used in the process of making nichrome resistors, and includes cerric ammonium nitrate, nitric acid, and acetic acid, for example, approximately in the concentrations of 4% cerric ammonium nitrate, 3% nitric acid, and 44% acetic acid by weight. A pre-cleaning process using 100:1 HF (hydrofluoric acid) is performed prior to subjecting a surface of the wafer substructure shown in FIG. 2 to an in situ sputter etching process for the purpose of removing any native oxide from the silicon surface before the above mentioned nickel deposition process is utilized to form the nickel layer 10. After the above mentioned first silicide anneal procedure has been performed, the chrome etch process is performed on the wafer structure shown in FIG. 8 to remove all un-reacted nickel and any nickel precipitates, resulting in the structure shown in FIG. 8. Then a sulfuric peroxide cleaning procedure is performed, followed by the above mentioned second silicide anneal procedure. Note that the entire chrome etch process can be performed at room temperature, which is a significant advantage because it avoids the need for providing a heated bath.

In addition to removing the un-reacted portion of nickel layer 10, the chrome etchant also removes all of any nickel oxide and/or any nickel nitride that may have been formed on nickel layer 10, in addition to removing any other nickel precipitates. (Formation of the above-mentioned nickel oxide or nickel nitride on nickel layer 10 could occur as a result of the ambient atmosphere in a process chamber or even a minor leak in the process chamber of the anneal system.) Thus, any thin layer of nickel oxide and/or nickel nitride and/or other nickel precipitate formed on nickel layer 10 is readily removed by the chrome etchant, thereby allowing the chrome etchant to also remove nickel underneath such nickel oxide, nickel nitride, or other nickel precipitate. Consequently there is no problem with silicon nitride bridging or pipe formation causing undesirable electrical shorting between the gate electrode and a source/drain electrode.

Figure 5:
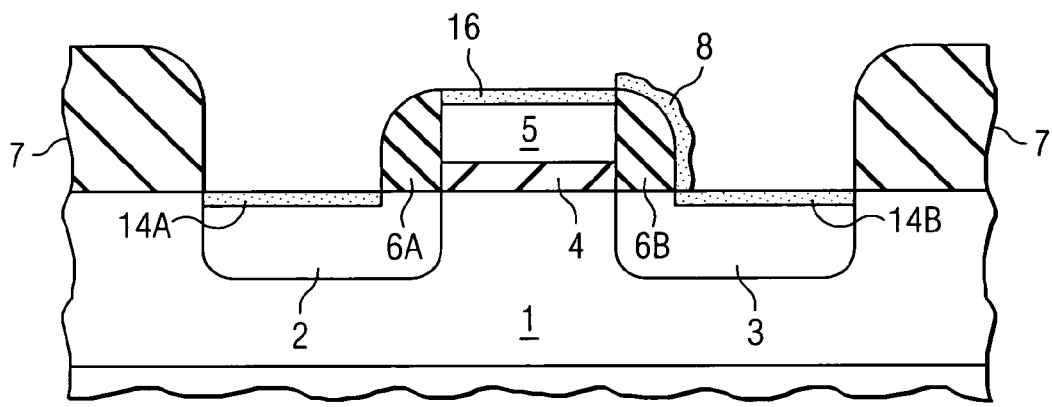

Thus, no nickel silicide bridging or pipe formation occurs on the surfaces of side-wall spacers 6A and/or 6B which can cause nickel nitride electrical shorting of the kind indicated by reference numeral 8 in prior art FIG. 5.

Figure 9:
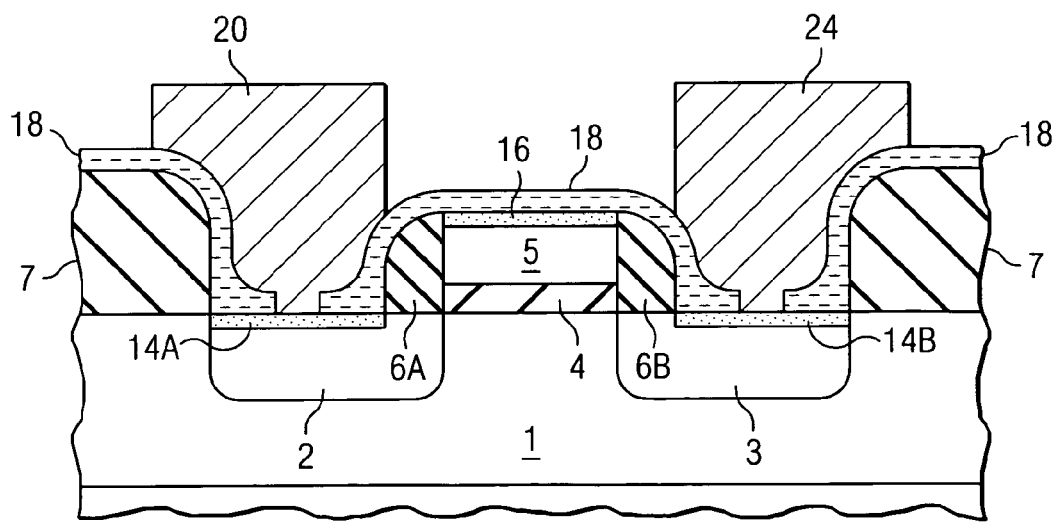

After the structure of FIG. 8 has been obtained, a second phase of the silicide formation is accomplished by means of a second anneal procedure at between approximately 400-550 degrees Centigrade for approximately 30 seconds to form the desired nickel silicide (NiSi) phase. Then, as indicated in FIG. 9, conventional metallization can be deposited and formed to make good, low contact resistance connection to the source and drain of the transistor through suitable contact openings in a pre-metal dielectric layer 18. Furthermore, the nickel silicide bridging/pipe formations which have been problematic in the prior art are avoided, resulting in higher integrated circuit manufacturing yields. Also, the use of the cap layer 12 shown in prior art FIGS. 3 and 4 is eliminated.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A method of making an integrated circuit including nickel silicide contact regions, comprising:
   (a) providing an integrated circuit structure including a silicon layer having a surface, a source region and a drain region of a transistor disposed in the silicon layer at its surface, a gate dielectric layer disposed on the surface of the silicon layer on an area located between the source region and the drain region, a polycrystalline silicon gate electrode disposed on the gate dielectric layer, a first dielectric spacer disposed on the surface of the silicon layer along an edge of the polycrystalline silicon gate electrode, and a second dielectric spacer disposed on the surface of the silicon layer along another edge of the polycrystalline silicon gate electrode, and a layer of a oxide and an opening in the layer of oxide exposing the source and a drain regions and also exposing at least a portion of the polycrystalline silicon gate electrode and also exposing surfaces of the first and second dielectric spacers;
   (b) forming a nickel layer on an exposed surface of the integrated circuit structure;
   (c) performing a first anneal to cause formation of first and second nickel silicide regions in surface portions of the source and drain regions, respectively, in contact with the nickel layer and to cause formation of a third nickel silicide region in the portion of the polycrystalline silicon gate electrode in contact with the nickel layer;
   (d) using a chrome etchant to perform an etch back operation to remove un-reacted nickel from the integrated circuit structure and to remove all nickel and/or nickel remnants from the exposed surfaces of the first and second dielectric spacers wherein the chrome etchant includes cerric ammonium nitrate, nitric acid, and acetic acid, the etch back operation including using the chrome etchant to remove all un-reacted nickel and any nickel precipitates from the integrated circuit structure.

2. The method of claim 1 including performing a second anneal to complete formation of the first, second, and third nickel silicide regions.

3. method of claim 1 including forming first and second metal layers electrically contacting the first and second nickel silicide layers, respectively.

4. The method of claim 1 wherein the chrome etchant includes approximately 4% cerric ammonium nitrate, 3% nitric acid, and 44% acetic acid.

5. The method of claim 1 including performing a sulfuric peroxide cleaning procedure on the integrated circuit structure prior to the second silicide annealing procedure.

6. The method of claim 1 wherein the etch back operation is performed at room temperature.

* * * * *